United States Patent
Xu et al.

(10) Patent No.: US 9,698,197 B2
(45) Date of Patent: Jul. 4, 2017

(54) HIGH-VOLTAGE FLIP LED CHIP AND MANUFACTURING METHOD THEREOF

(71) Applicant: ENRAYTEK OPTOELECTRONICS CO., LTD., Shanghai (CN)

(72) Inventors: Huiwen Xu, Shanghai (CN); Yu Zhang, Shanghai (CN); Qiming Li, Shanghai (CN)

(73) Assignee: ENRAYTEK OPTOELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/176,629

(22) Filed: Jun. 8, 2016

(65) Prior Publication Data

US 2016/0365485 A1 Dec. 15, 2016

(30) Foreign Application Priority Data

Jun. 12, 2015 (CN) .......................... 2015 1 03240567

(51) Int. Cl.
*H01L 27/15* (2006.01)
*H01L 33/32* (2010.01)
*H01L 33/00* (2010.01)

(52) U.S. Cl.
CPC .......... *H01L 27/153* (2013.01); *H01L 33/007* (2013.01); *H01L 33/32* (2013.01)

(58) Field of Classification Search
CPC ....................................................... H01L 33/24
See application file for complete search history.

(56) References Cited

U.S. PATENT DOCUMENTS

| | | | | |
|---|---|---|---|---|
| 6,410,942 B1* | 6/2002 | Thibeault | ............... | B82Y 20/00 257/79 |
| 8,053,757 B2* | 11/2011 | Jiang | ................... | H01L 21/0254 257/14 |
| 2002/0177251 A1* | 11/2002 | Ye | ....................... | H01L 21/2683 438/47 |
| 2007/0145379 A1* | 6/2007 | Eliashevich | .......... | H01L 33/382 257/79 |

(Continued)

*Primary Examiner* — Calvin Choi
*Assistant Examiner* — S. M. S Imtiaz
(74) *Attorney, Agent, or Firm* — Oliff PLC

(57) ABSTRACT

A high-voltage flip LED chip and a manufacturing method thereof. In the high-voltage flip LED chip, a P-N electrode connecting metal block is filled into an isolation trench between two adjacent chip units and is respectively filled into a first electrode hole of one chip unit and a second electrode hole of the other chip unit to serially connect the two adjacent chips. Since the chip units are interconnected by adopting large-area metal and the metal is filled into the isolation trench, not only can the high luminous efficiency of the chip be guaranteed, but also the high reliability and excellent current spreading between the units are guaranteed, the process stability can be improved, and the rate of non-defective products and the product reliability are improved; since the isolation trenches between the chip units adopt an ODR design, the reflectivity of reflectors at the trenches can be improved and the absorption by electrodes is reduced; and since the chip has large-area spacing-controllable P and N electrodes, the heat dissipating capability of the chip is guaranteed to be good and simultaneously the packaging difficulty is reduced.

12 Claims, 8 Drawing Sheets

(56) References Cited

U.S. PATENT DOCUMENTS

| | | | |
|---|---|---|---|
| 2007/0228393 A1* | 10/2007 | Yoneda | H01L 33/22 257/79 |
| 2009/0284130 A1* | 11/2009 | Tsuji | H01L 25/0753 313/502 |
| 2010/0230656 A1* | 9/2010 | O'Keefe | H01L 21/02381 257/13 |
| 2010/0244082 A1* | 9/2010 | Lin | H01L 33/0095 257/99 |
| 2014/0252309 A1* | 9/2014 | Shi | H01L 33/06 257/13 |
| 2015/0014628 A1* | 1/2015 | Chung | H01L 27/0694 257/13 |
| 2015/0263224 A1* | 9/2015 | Zhang | H01L 33/007 257/13 |
| 2015/0318444 A1* | 11/2015 | Huang | H01L 25/0753 257/99 |

* cited by examiner

HIGH-VOLTAGE FLIP LED CHIP AND MANUFACTURING METHOD THEREOF

BACKGROUND OF THE PRESENT INVENTION

Field of Invention

The present invention relates to the field of LED chips and more specifically relates to a high-voltage flip LED chip and a manufacturing method thereof.

Description of Related Arts

An LED (Light Emitting Diode) is a semiconductor light emitting device and hasphotoelectric performance features of low energy consumption, small size, long service life, good stability, quick response, stable emitted light wavelength and the like. At present, LEDs have already been widely applied in fields of illumination, household electric appliances, display screens, indicating lamps, etc.

In recent years, in order to improve the illumination quality and integration level of LED products, unit area luminous efficiency ($lm/W/cm^2$) has already been an important index for measuring LED chips. Compared with the traditional GaN-based LED normal structure, due to excellent heat dissipating capability and current spreading capability, flip chips become hot products which can satisfy the development trend. On this basis, high-voltage flip products formed by using flip LED chips through serial connection guarantee high unit area luminous efficiency, simultaneously facilitate great decrease of driver costs thereof and become a trend of LED chip development in future.

Usually, a high-voltage LED chip uses fine metal electrodes to bridge different chip units. However, by adopting this interconnection method, electrodes are easily broken at steps and result in a death lamp ; and the process requirement thereof is comparatively higher and the rate of non-defective products is easily decreased. Patent 201210564002.4 introduces a high-voltage flip LED chip. Although this chip solves the packaging problem to a certain extent, the principle thereof is not changed, finally the packaging contact points are still comparatively small and the alignment difficulty during bonding is great.

Therefore, how to provide a novel high-voltage flip LED chip and a manufacturing method thereof to improve the metal interconnection between LED chip units, improve the process stability, improve the rate of non-defective products and the product reliability and improve the extendibility of type design and the luminous efficiency of the LED chip becomes an important technical problem which needs to be urgently solved by one skilled in the art.

SUMMARY OF THE PRESENT INVENTION

In view of the disadvantages of the prior art, the purpose of the present invention is to provide a high-voltage flip LED chip and a manufacturing method thereof to solve the problems that lamps are easily caused to die out and the rate of non-defectively is easily decreased for a reason that LED chip units are interconnected by adopting fine metal electrodes in the prior art.

In order to achieve the above-mentioned purpose and other related purposes, the present invention provides a manufacturing method of a high-voltage flip LED chip, which comprises the following steps:

providing a substrate, and sequentially growing an N-type GaN layer, a multi-quantum-well layer and a P-type GaN layer on the substrate;

downwards etching from a surface of the P-type GaN layer to form a plurality of isolation trenches to obtain a plurality of chip units through isolation, bottoms of the isolation trenches exposing the substrate;

forming at least one opening in each chip unit to obtain an MESA, the opening downwards extending from the surface of the P-type GaN layer and exposing the N-type GaN layer;

forming a P electrode extension layer on the MESA;

depositing a first insulating layer which covers a surface of the P electrode extension layer, a surface of the opening and a surface of the isolation trench, and forming, in the first insulating layer above each chip unit, at least one first electrode hole for exposing the P electrode extension layer and at least one second electrode hole for exposing the N-type GaN layer in the opening; and for each high-voltage circuit, forming at least one discrete N electrode connecting metal block, P-N electrode connecting metal block and P electrode connecting metal block on a surface of the first insulating layer, wherein the N electrode connecting metal block is filled into the second electrode hole of one chip unit at a head end of the high-voltage circuit; the P electrode connecting metal block is filled into the first electrode hole of one chip unit at a tail end of the high-voltage circuit; and the P-N electrode connecting metal block is filled into the isolation trench between two adjacent chip units and is respectively filled into the first electrode hole of one chip unit and the second electrode hole of the other chip unit to serially connect the two adjacent units.

Optionally, the substrate is flip-bonded with a base board through the N electrode connecting metal block, the P-N electrode connecting metal block and the P electrode connecting metal block.

Optionally, after the N electrode connecting metal block, the P-N electrode connecting metal block and the P electrode connecting metal block are formed, a second insulating layer which covers each chip unit is deposited, and at least one N electrode hole for exposing the N electrode connecting metal block and at least one P electrode hole for exposing the P electrode connecting metal block are respectively formed in the second insulating layer on the chip units at the head and tail ends of the high-voltage circuit; and then discrete N electrode metal layer and P electrode metal layer are formed on a surface of the second insulating layer, wherein the N electrode metal layer is filled into the N electrode hole and the P electrode metal layer is filled into the P electrode hole.

Optionally, the substrate is flip-bonded with a base board through the P electrode metal layer and the N electrode metal layer.

Optionally, the substrate is a plane substrate or a PSS patterned substrate.

Optionally, a side wall of the opening is vertical or oblique.

Optionally, the P electrode extension layer is a transparent conductive film, a metal layer or a composite layer of the transparent conductive film and the metal layer.

Optionally, the chip unit is in a strip shape, a round hole shape or a polygonal hole shape; and the opening is in a strip shape, a round hole shape or a polygonal hole shape.

The present invention further provides a high-voltage flip LED chip, which comprises:

a substrate, and an N-type GaN layer, a multi-quantum-well layer and a P-type GaN layer sequentially formed on the substrate;

a surface of the P-type GaN layer downwards extends to form a plurality of isolation trenches, bottoms of the isolation trenches expose the substrate and a plurality of chip units are obtained through isolation;

at least one opening is formed in each chip unit, and the opening downwards extends from the surface of the P-type GaN layer and exposes the N-type GaN layer; and the surface of the P-type GaN layer around the opening forms a MESA;

a P electrode extension layer is formed on the MESA;

a first insulating layer covers a surface of the P electrode extension layer, a surface of the opening and a surface of the isolation trench, at least one first electrode hole for exposing the P electrode extension layer and at least one second electrode hole for exposing the N-type GaN layer in the opening are formed in the first insulating layer above each chip unit; and for each high-voltage circuit, at least one discrete N electrode connecting metal block, P-N electrode connecting metal block and P electrode connecting metal block are formed on a surface of the first insulating layer, wherein the N electrode connecting metal block is filled into the second electrode hole of one chip unit at a head end of the high-voltage circuit; the P electrode connecting metal block is filled into the first electrode hole of one chip unit at a tail end of the high-voltage circuit; and the P-N electrode connecting metal block is filled into the isolation trench between two adjacent chip units and is respectively filled into the first electrode hole of one chip unit and the second electrode hole of the other chip unit to serially connect the two adjacent units.

Optionally, the substrate is flip-bonded with a base board through the N electrode connecting metal block, the P-N electrode connecting metal block and the P electrode connecting metal block.

Optionally, a second insulating layer further covers the N electrode connecting metal block, the P-N electrode connecting metal block and the P electrode connecting metal block, at least one N electrode hole for exposing the N electrode connecting metal block is formed in the second insulating on the chip unit at the head end of the high-voltage circuit and at least one P electrode hole for exposing the P electrode connecting metal block is formed in the second insulating layer on the chip unit at the tail end of the high-voltage circuit; and discrete N electrode metal layer and P electrode metal layer are further formed on a surface of the second insulating layer, wherein the N electrode metal layer is filled into the N electrode hole and the P electrode metal layer is filled into the P electrode hole.

Optionally, the substrate is flip-bonded with a base board through the P electrode metal layer and the N electrode metal layer.

As described above, the high-voltage flip LED chip and the manufacturing method thereof provided by the present invention have the following beneficial effects: (1) in the LED chip provided by the present invention, the structures of the chip units are substantially consistent, the extendibility is good and the change of working voltage of the chip can be realized by simply increasing basic units; (2) since the chip units are interconnected by adopting large-area metal and the connecting metal layers have large-area metal for connection in the isolation trenches, the connecting positions are firmer, the problem of poor product reliability is not easily caused, the final electrode layer can be restored as a one-P and one-N structure, the process stability can be improved and the rate of non-defective products and the product reliability are improved; (3) the current spreading capability of the basic chip units is good and a guarantee is provided for high luminous efficiency; (4) the combination of the first insulating layer, the second insulating layer and the interconnecting metal layers form an omnidirectional reflector (ODR) with high reflectivity, the reflecting capability of the reflecting layer can be greatly improved and the luminous efficiency of the LED chip is increased; and simultaneously the insulating layers and metal layers in the isolation trenches also form an omnidirectional reflector, and the luminous efficiency of the product is improved; and (5) the packaging is simple to perform, the large symmetrical electrode structure facilitates the improvement of the packaging simplicity of the chip, the rate of non-defective packaging is improved and simultaneously the heat dissipating capability of the chip is improved.

Figure 1:
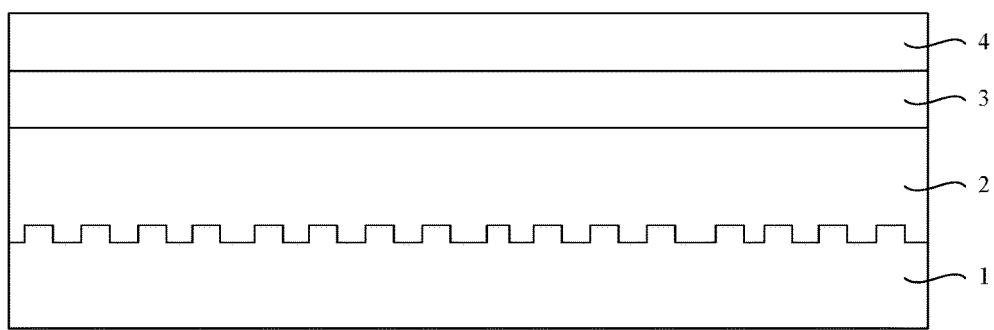
FIG. 1 illustrates a schematic view of sequentially growing an N-type GaN layer, a multi-quantum-well layer and a P-type GaN layer on a substrate in a manufacturing method of a high-voltage flip LED chip provided by the present invention.

DESCRIPTION OF REFERENCE SIGNS 1 substrate
2 N-type GaN layer
3 multi-quantum-well layer
4 P-type GaN layer
5 isolation trench
6 opening
7 P electrode extension layer
8 first insulating layer
9 first electrode hole
10 second electrode hole
11 N electrode connecting metal block
12 P-N electrode connecting metal block
13 P electrode connecting metal block
14 Second insulating layer
15 N electrode hole
16 P electrode hole
17 N electrode metal layer
18 P electrode metal layer
19 base board

DETAILED DESPRIPTION OF THE PREFERRED EMBODIMENTS

The embodiments of the present invention will be described below through specific examples. One skilled in the art can easily understand other advantages and effects of the present invention according to contents disclosed by the description. The present invention can also be implemented or applied through other different specific embodiments, and various modifications or variations can also be made to various details in the description based on different points of view and applications without departing from the spirit of the present invention.

Please refer to FIG. 1 to FIG. 15. It needs to be stated that the drawings provided in the embodiments are just used for exemplarily describing the basic concept of the present invention, thus only illustrate components related to the present invention and are not drawn according to numbers, shapes and sizes of components during actual implementation, the pattern, number and scale of each component during actual implementation can be freely varied and the layout patterns of the components may be more complex.

Embodiment 1

The present invention provides a manufacturing method of a high-voltage flip LED chip, which at least comprises the following steps:

Firstly referring to FIG. 1, a substrate 1 is provided, and an N-type GaN layer 2, a multi-quantum-well layer 3 and a P-type GaN layer 4 are sequentially grown on the substrate 1.

Specifically, the substrate 1 can be a substrate such as a sapphire, spinel ($MgAl_2O_4$), SiC, ZnS, ZnO or GaAs substrate which is suitable for LED chip manufacturing. In this embodiment, the substrate 1 is preferably a sapphire substrate, and the N-type GaN layer 2, the multi-quantum-well layer 3 and the P-type GaN layer 4 are sequentially grown thereon by adopting an epitaxial method.

Further, the substrate 1 can be a plane substrate or a PSS patterned substrate. PSS (Patterned Sapphire Substrate) is commonly called as patterned substrate, i.e., a mask for dry etching is grown on the sapphire substrate, a pattern is etched on the mask by using a standard photoetching process, sapphire is etched by using an ICP etching technique, after that the mask is removed and then a GaN material is grown thereon, such that a longitudinal epitaxy of the GaN material becomes a transverse epitaxy. In one aspect, the PPS substrate can effectively reduce the dislocation density of the GaN epitaxial material, thus the nonradiative recombination of an active region is reduced, the internal quantum efficiency is improved, the reverse leakage current is reduced and the service life of the LED is improved; and in another aspect, light emitted by the active region is repetitively scattered by a GaN and sapphire substrate interface for several times, an angle of emergence of totally reflected light is changed, the probability of emergence of light of the flip LED from the sapphire substrate is increased and thus the light extraction efficiency is improved. FIG. 1 illustrates a situation that the PPS patterned substrate is adopted.

Figure 2:
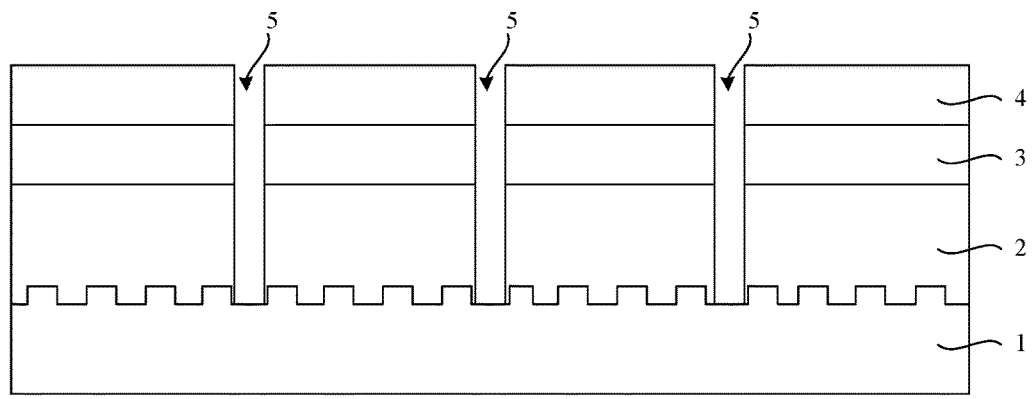
FIG. 2 illustrates a schematic view of forming a plurality of isolation trenches in the manufacturing method of the high-voltage flip LED chip provided by the present invention.
Figure 3:
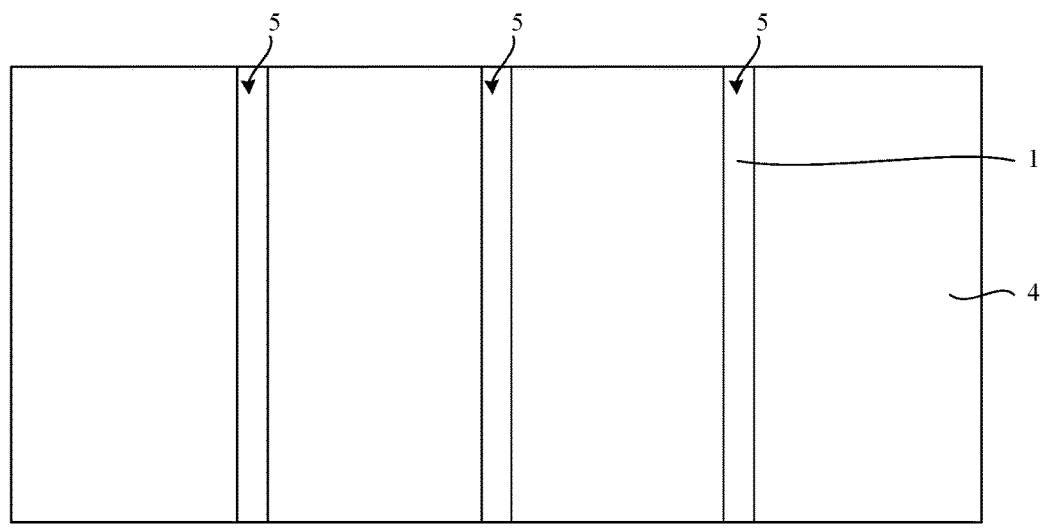
FIG. 3 illustrates a top view of the structure shown in FIG. 2.

Then referring to FIG. 2 and FIG. 3, downwards etching from a surface of the P-type GaN layer 4 is performed to form a plurality of isolation trenches 5 to obtain a plurality of chip units through isolation, bottoms of the isolation trenches 5 exposing the substrate 1.

Specifically, the chip units are in a shape including but not limited to strip shape, round hole shape or polygonal hole shape, and the effect that a side wall of the isolation trench 5 is vertical or oblique can be further realized by controlling etching conditions. In this embodiment, the chip units are preferably in a strip shape, as shown in FIG. 3 which illustrates a top view of the structure shown in FIG. 2. As an example, FIG. 2 and FIG. 3 only illustrate four chip units which are arranged in parallel in a line. However, it should be known that, according to the area of the substrate and the shape and size of each chip unit, the number of the chip units can also be adjusted, other arrangement mode can be adopted and thus the protection range of the present invention is not hereby limited thereto.

Figure 4:
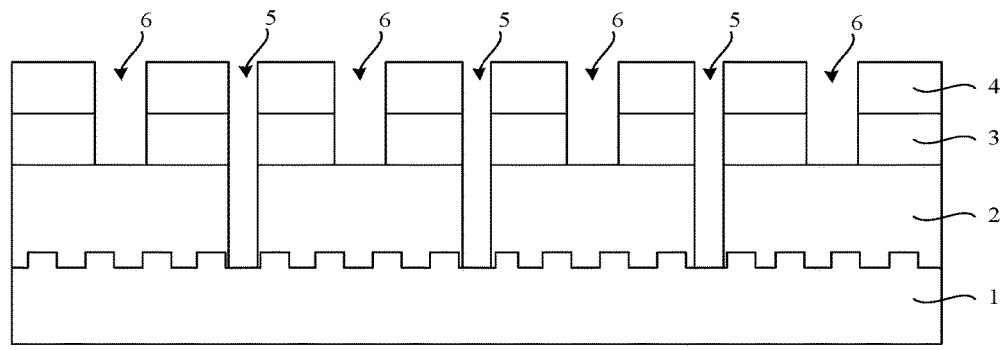
FIG. 4 illustrates a schematic view of forming an opening in each chip unit to obtain a MESA in the manufacturing method of the high-voltage flip LED chip provided by the present invention.
Figure 5:
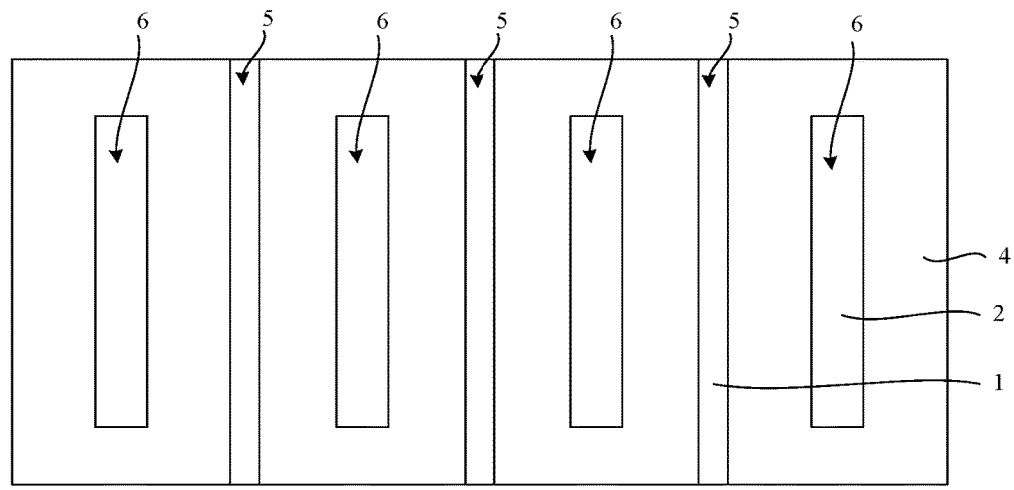
FIG. 5 illustrates a top view of the structure shown in FIG. 4.

Then referring to FIG. 4 and FIG. 5, at least one opening 6 is formed in each chip unit to obtain an MESA (an upper surface of the P-type GaN layer around the opening), the opening 6 downwards extending from the surface of the P-type GaN layer 4 and exposing the N-type GaN layer 2. In this embodiment, a number of the opening in each chip unit which is one is taken as an example, and in other embodiments, other numbers can also be adopted.

Specifically, GaN is selectively etched under a plasma state by using gas such as $BCl_3$, $Cl_2$ or Ar till the N type GaN layer 2 is exposed to form a MESA. The openings 6 are in a shape including but not limited to strip shape, round hole shape or polygonal hole shape, and the position of the opening 6 can be adjusted according to the actual needs. In this embodiment, the opening 6 is also preferably in a strip shape and is located in a center of each chip unit. Further, the effect that the side wall of the opening 6 is vertical or oblique can be realized by controlling etching conditions.

Figure 6:
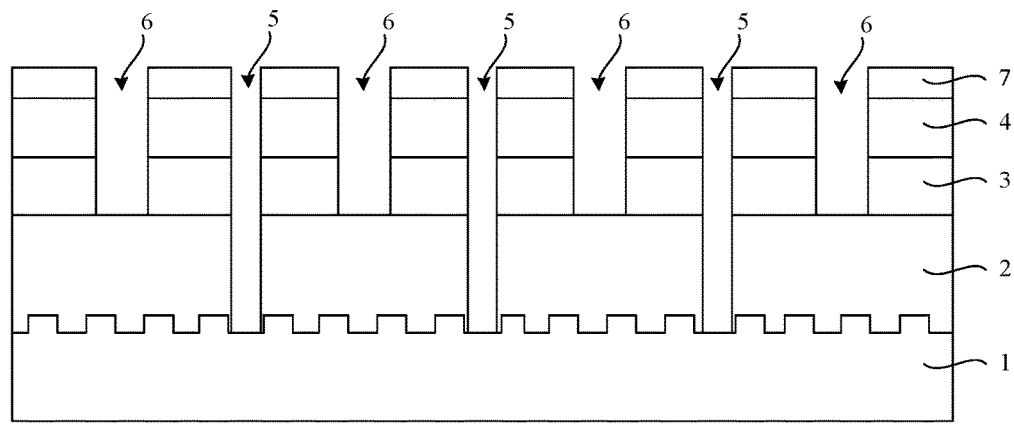
FIG. 6 illustrates a schematic view of forming a P electrode extension layer on the MESA in the manufacturing method of the high-voltage flip LED chip provided by the present invention.

Then referring to FIG. 6, a P electrode extension layer 7 is formed on the MESA.

Specifically, the P electrode extension layer 7 is a transparent conductive film, a metal layer or a composite layer of the transparent conductive film and the metal layer. The transparent conductive layer can be made of ITO, AZO or ZnO, and the metal layer is an Ag, Al, Rh, Ru, TiW, Ti, Pt, Ni or Cr single metal layer or a composite layer of at least two thereof. Process steps for forming the P electrode extension layer can be 1-4 steps.

Figure 7:
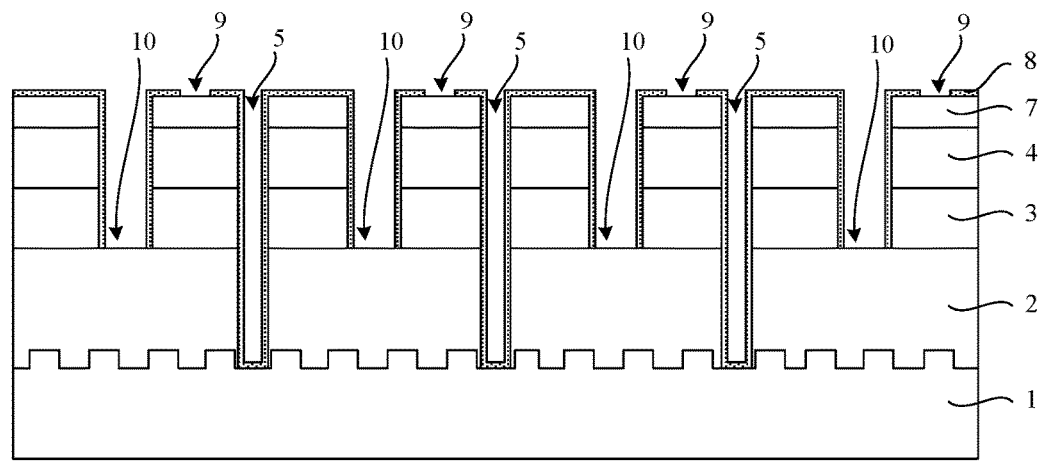
FIG. 7 illustrates a schematic view of depositing a first insulating layer and forming a first electrode hole and a second electrode hole in the manufacturing method of the high-voltage flip LED chip provided by the present invention.
Figure 8:
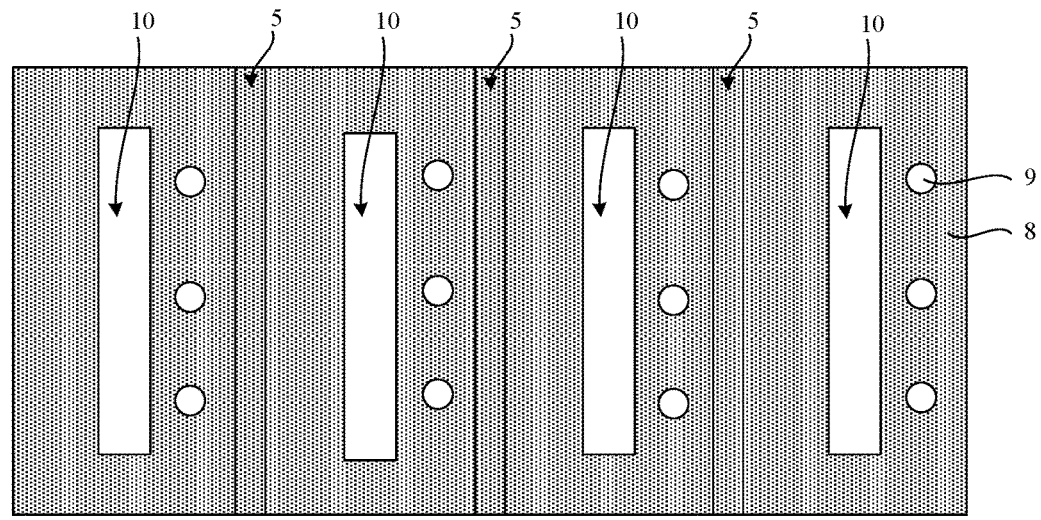
FIG. 8 illustrates a top view of the structure shown in FIG. 7.

Please referring to FIG. 7 and FIG. 8, a first insulating layer 8 which covers a surface of the P electrode extension layer 7, a surface of the opening 6 and a surface of the isolation trench 5 is deposited, and at least one first electrode hole 9 for exposing the P electrode extension layer 7 and at least one second electrode hole 10 for exposing the N-type GaN layer 2 in the opening 6 are formed in the first insulating layer 8 above each chip unit.

Preferably, for each chip unit which is sequentially arranged in a line or a row and are used for being subsequently and serially connected to form a high-voltage circuit, the first electrode holes 9 are all located in first sides of the openings 6. As shown in FIG. 7 and FIG. 8, what is shown in this embodiment is a situation that four chip units are sequentially arranged in a line and the first electrode holes 9 are all located in right sides of the openings 6. In other embodiments, the positions of the first electrode holes 9 can be adjusted according to the actual needs in combination with the specific arrangement situation of the chip units.

Specifically, the first insulating layer 8 is grown by adopting a method such as electron beam evaporation or PECVD, and the material of the first insulating layer 8 can be $SiO_2$, SiON, $Al_2O_3$, $TiO_2$ and the like or a stack structure (DBR) based on the material. Then, the first electrode hole 9 and the second electrode hole 10 are formed by adopting a dry etching or wet etching method. FIG. 8 illustrates a top view of the structure shown in FIG. 7. As shown in FIG. 8, the first electrode hole 9 is round, and the second electrode hole 10 is consistent with the shape of the opening 6 and is in a long-strip rectangular shape. In other embodiments, the first electrode hole 9 and the second electrode hole 10 can also be in other shapes, such as square shape and regular polygonal shape. In FIG. 8, each chip unit comprises one first electrode hole 10 and three first electrode holes 9 which are arranged in a row. However, it should be known that the numbers and distribution of the first electrode holes 9 and the second electrode holes 10 can be adjusted during actual manufacturing according to the actual situations.

In addition, in this embodiment, the first sides which are right sides are taken as an example, thus the second sides are left sides opposite to the right sides, and vice versa.

Figure 9:
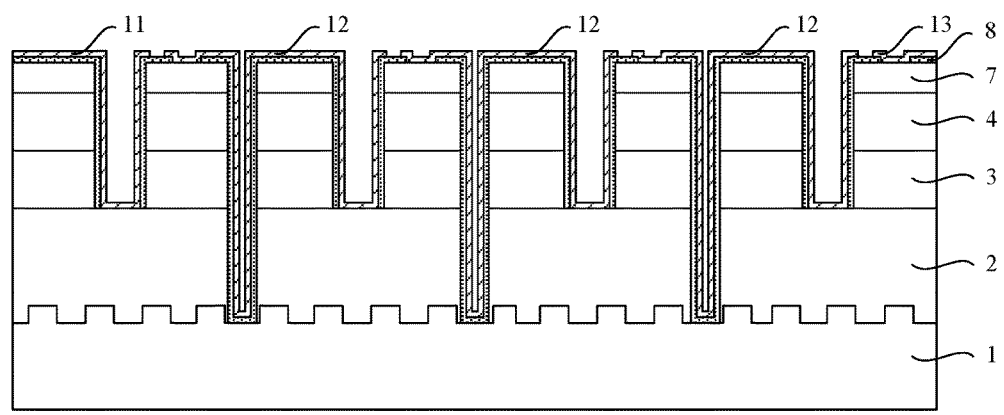
FIG. 9 illustrates a schematic view of forming discrete N electrode connecting metal block, P-N electrode connecting metal block and P electrode connecting metal block in the surface of the first layer in the manufacturing method of the high-voltage flip LED chip provided by the present invention.
Figure 10:
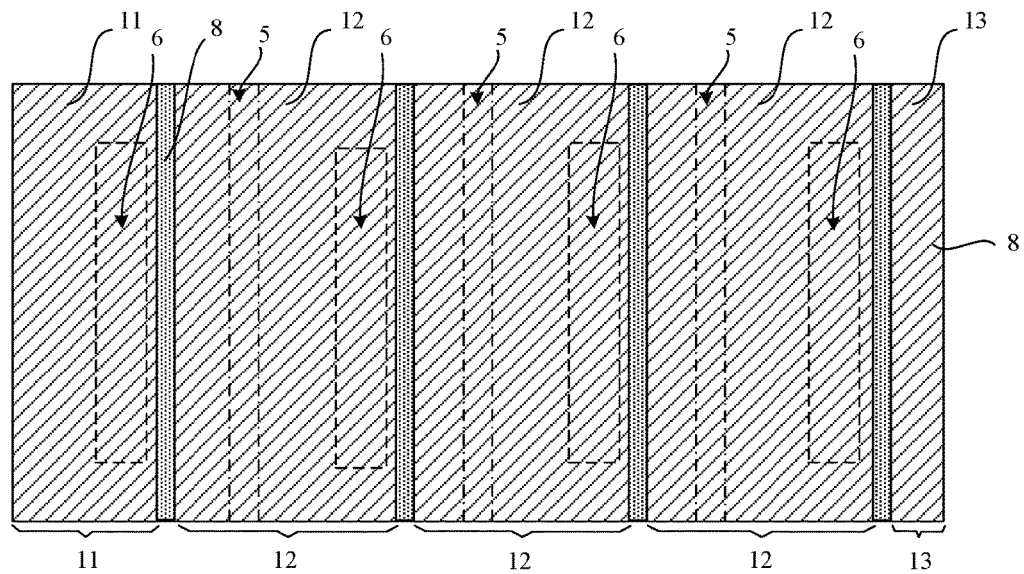
FIG. 10 illustrates a top view of the structure shown in FIG. 9.

Then referring to FIG. 9 and FIG. 10, for each high-voltage circuit, at least one discrete N electrode connecting metal block 11, P-N electrode connecting metal block 12 and P electrode connecting metal block 13 are formed on a surface of the first insulating layer 8, wherein the N electrode connecting metal block 11 is filled into the second electrode hole 10 of one chip unit at a head end of the high-voltage circuit; the P electrode connecting metal block 13 is filled into the first electrode hole 9 of one chip unit at a tail end of the high-voltage circuit; and the P-N electrode connecting metal block 12 is filled into the isolation trench 5 between two adjacent chip units and is respectively filled into the first electrode hole 9 of one chip unit and the second electrode hole 10 of the other chip unit to serially connect the two adjacent units.

Therein, FIG. 10 illustrates a top view of the structure shown in FIG. 9. In order to better display a relative position relationship among all parts, FIG. 10 illustrates the positions of the isolation trenches 5 and the openings 6 by using dotted lines, and respectively illustrates crossing regions of the N electrode connecting metal block 11, the P-N electrode connecting metal blocks 12 and the P electrode connecting metal block 13 by using braces.

Specifically, metal deposition or evaporation in selective regions is performed on the chip by adopting a negative photoresist lift-off method or other methods to obtain the N electrode connecting metal block 11, the P-N electrode connecting metal blocks 12 and the P electrode connecting metal block 13, metal materials can be metals such as Ag, Al, Rh, Cr, Pt, Au, Ti and Ni or stack structures consisting of at least two thereof.

Therein, the N electrode connecting metal block 11 is connected with the N-type GaN layer of the chip unit at the head end of the high-voltage circuit through the second electrode hole 10 in the opening 6; the P electrode connecting metal block 13 is connected with the P-type GaN layer of the chip unit at the tail end of the high-voltage circuit through the first electrode hole 9; and the P-N electrode connecting metal block 12 is connected with the P-type GaN layer of one chip unit through the first electrode hole 9 and is connected with the N-type GaN layer of the other adjacent chip unit through the second electrode hole 10 to serially connect two adjacent chip units to finally form a high-voltage circuit.

Specifically, the areas of the N electrode connecting metal block 11, the P electrode connecting metal block 13 and the P-N electrode connecting metal blocks 12 can be larger, such that large-area metal interconnection among the chip units is realized and the spreading resistance of current on the metal can be enhanced. Simultaneously, since the P-N electrode connecting metal blocks 12 are filled into the isolation trenches 5, the interconnection reliability of the isolation trenches can be improved. Further, metal and insulating materials in the isolation trenches form an ODR, the reflecting capability is greatly improved and thus the product quality and luminous efficiency are improved.

In this embodiment, the substrate 1 can be flip-bonded with a base board through the N electrode connecting metal block 11, the P electrode connecting metal block 13 and the P-N electrode connecting metal blocks 12 to form a high-voltage flip LED chip (not shown). Since the electrodes of the chip is substantially the same as the electrode structures of normally flip LED chips (except that the isolation trenches therein have large-area metal for connection), a mature process can be used for packaging and the packaging difficulty is not additionally increased; and in addition, since the isolation trenches therein have large-area metal for connection in the chip provided by the present invention, the connecting positions are enabled to be firmer, the problem of poor product reliability is not easily caused and the problem that open circuit at the positions of the isolation trenches is easily caused in the high-voltage LED chip in the prior art is effectively improved.

Figure 11:
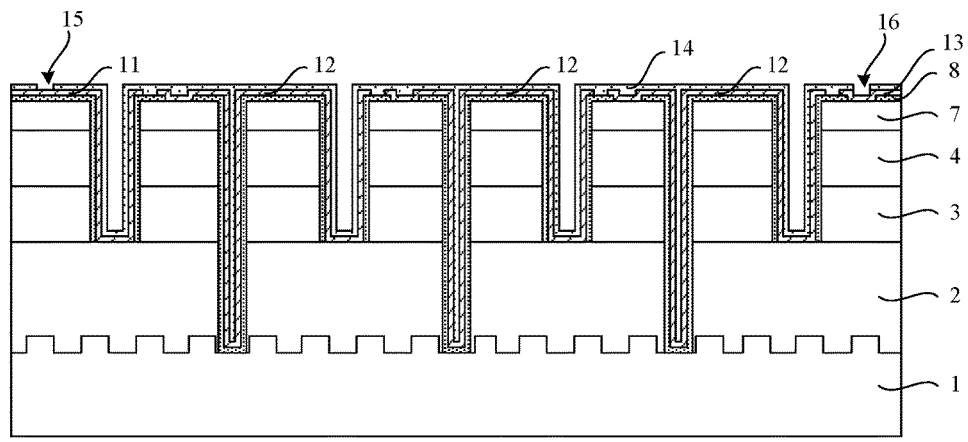
FIG. 11 illustrates a schematic view of depositing a second insulating layer and forming at least one N electrode hole and at least one P electrode hole in the manufacturing method of the high-voltage flip LED chip provided by the present invention.
Figure 12:
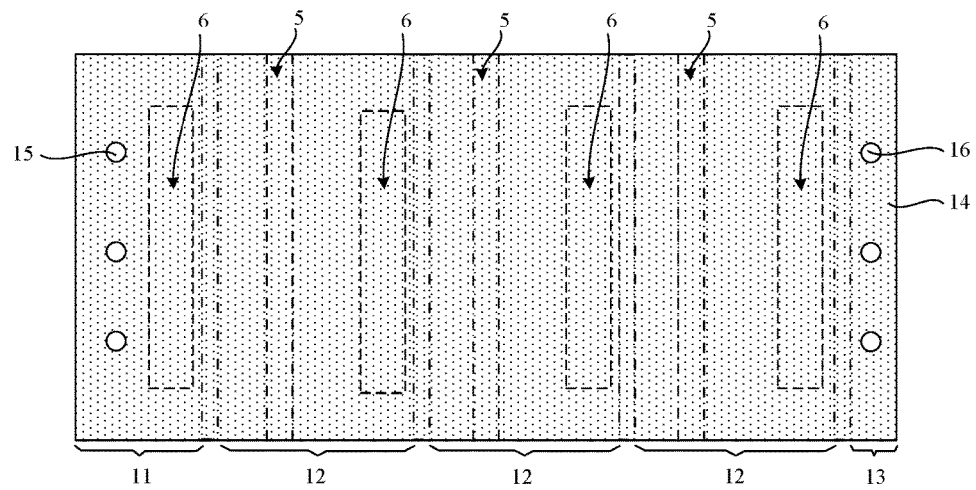
FIG. 12 illustrates the top view of a structure shown in FIG. 11.

Please referring FIG. 11 and FIG. 12, in another embodiment, after the N electrode connecting metal block 11, the P-N electrode connecting metal blocks 12 and the P electrode connecting metal block 13 are formed, a second insulating layer 14 which covers each chip unit is deposited, and at least one N electrode hole 15 for exposing the N electrode connecting metal block 11 and at least one P electrode hole 16 for exposing the P electrode connecting metal block 13 are respectively formed in the second insulating layer 14 on the chip units at the head and tail ends of the high-voltage circuit.

Specifically, the second insulating layer 14 is grown by adopting a method such as electron beam evaporation or PECVD, and then electrode hole patterns are made by adopting a dry etching or wet etching method. The material of the second insulating layer 14 can be $SiO_2$, SiON, $Al_2O_3$, $TiO_2$ and the like or a stack structure (DBR) based on the material.

Figure 13:
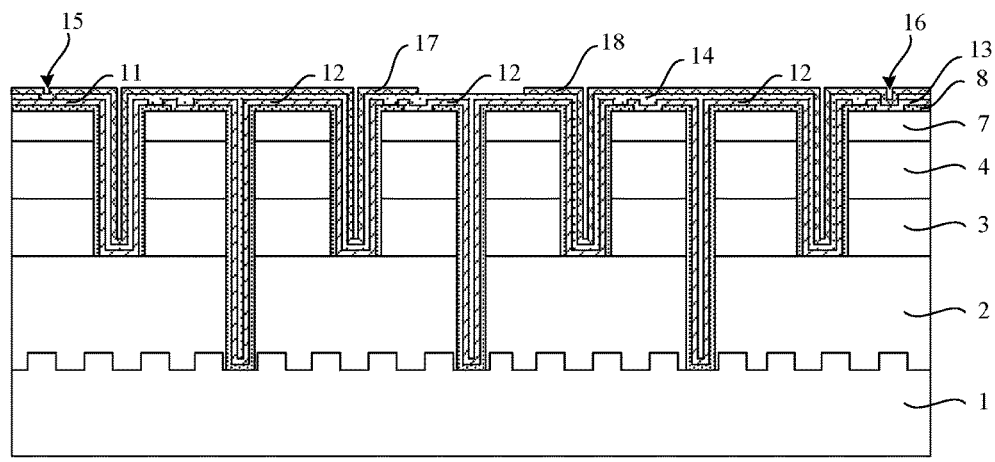
FIG. 13 illustrates a schematic view of forming discrete N electrode metal layer and P electrode metal layer on a surface of the second insulating layer in the manufacturing method of the high-voltage flip LED chip provided by the present invention.
Figure 14:
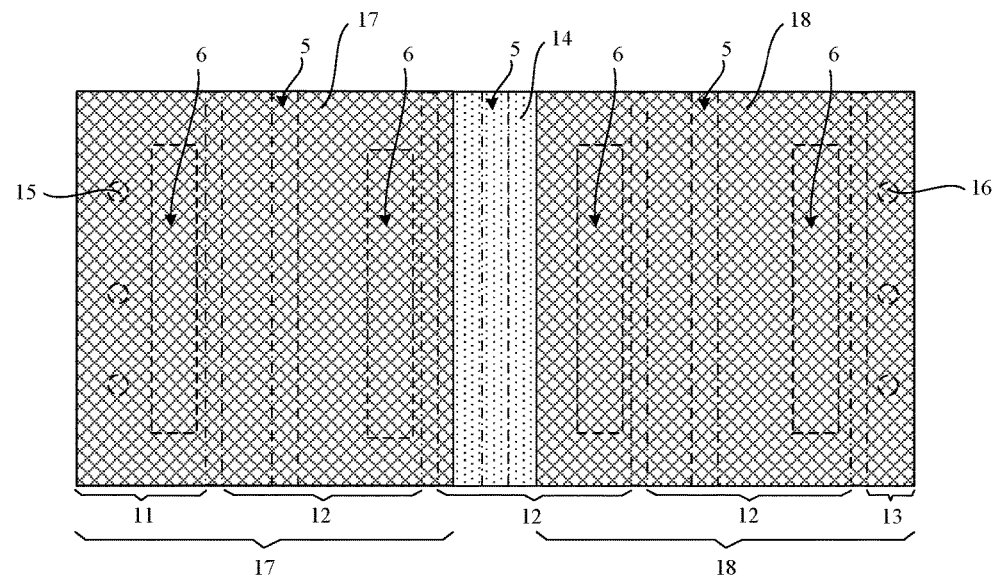
FIG. 14 illustrates a top view of the structure shown in FIG. 13.

Then referring to FIG. 13 and FIG. 14, discrete N electrode metal layer 17 and P electrode metal layer 18 are formed on a surface of the second insulating layer 14, wherein the N electrode metal layer 17 is filled into the N electrode hole 15 and the P electrode metal layer 18 is filled into the P electrode hole 16.

Specifically, the N electrode metal layer 17 and the P electrode metal layer 18 are prepared by adopting a negative photoresist lift-off method or other methods, and electrode materials can be Cr, Ni, Ti, Pt, Ag, Al, Rh, Au, Sn and the like or stack structures based on at least two thereof. The N electrode metal layer 17 is used as an N electrode of the high-voltage circuit and the P electrode metal layer 18 is used as a P electrode of the high-voltage electrode. The N electrode metal layer 17 and the P electrode metal layer 18 adopt large-area metal. Spacing between the N electrode metal layer 17 and the P electrode metal layer 18 can be adjusted according to the actual needs. The large-area spacing-controllable P and N electrodes can guarantee the chip to have good heat dissipating capability and simultaneously reduce the packaging difficulty.

Figure 15:
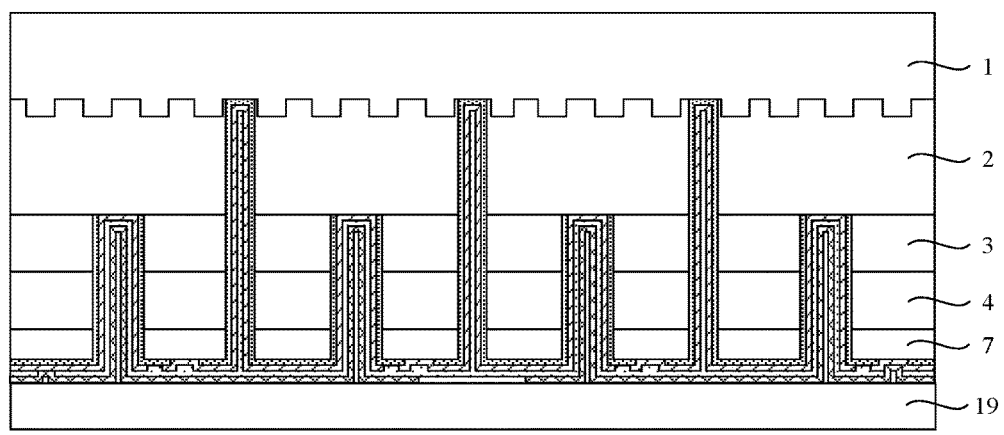
FIG. 15 illustrates a schematic view of bonding the substrate with a base board through the N electrode metal layer and the P electrode metal layer to form the high-voltage flip LED chip in the manufacturing method of the high-voltage flip LED chip provided by the present invention.

Finally referring to FIG. 15, the substrate 1 is flip-bonded with a base board 19 through the P electrode metal layer 18 and the N electrode metal layer 17 to form the high-voltage flip LED chip.

Specifically, a circuit is formed on the base board. The flip device can be further cut to form a high-voltage LED chip grain consisting of a plurality of light emitting units.

In the LED chip manufactured by the present invention, the basic chip units have good current spreading capability and the high luminous efficiency is guaranteed; since the chip units are interconnected by adopting large-area metal, the high reliability and excellent current spreading between the units of the chip are guaranteed, the process stability can be improved, and the rate of non-defective products and the product reliability are improved; the structures of the chip units are substantially consistent, the extendibility is good and the change of working voltage of the chip can be realized by simply increasing basic units; since the isolation trenches between the chip units adopt an ODR design, the reflectivity of reflectors at the trenches is improved and the absorption by electrodes is reduced; and since the chip has large-area spacing-controllable P and N electrodes, the heat dissipating capability of the chip is guaranteed to be good and simultaneously the packaging difficulty is reduced. In the manufacturing method of the high-voltage flip LED chip provided by the invention, the sequence of all process steps can also be flexibly adjusted according to the needs.

Embodiment 2

The present invention further provides a high-voltage flip LED chip. Please refer to FIG. 13 to FIG. 15, wherein FIG. 13 illustrates a sectional view before bonding an LED chip to a base board, FIG. 14 illustrates a top view of the structure shown in FIG. 13 and FIG. 15 illustrates a sectional view of the structure after bonding the LED chip to the base board. As shown in the drawings, the high-voltage flip LED chip at least comprises:

a substrate 1, and an N-type GaN layer 2, a multi-quantum-well layer 3 and a P-type GaN layer 4 sequentially formed on the substrate 1;

a surface of the P-type GaN layer 4 downwards extends to form a plurality of isolation trenches 5, bottoms of the isolation trenches 5 expose the substrate 1 and a plurality of chip units are obtained through isolation;

at least one opening 6 is formed in each chip unit, and the opening 6 downwards extends from the surface of the P-type GaN layer 4 and exposes the N-type GaN layer 2; and the surface of the P-type GaN layer 4 around the opening 6 forms a MESA;

a P electrode extension layer 7 is formed on the MESA;

a first insulating layer 8 covers a surface of the P electrode extension layer 7, a surface of the opening 6 and a surface of the isolation trench 5, at least one first electrode hole 9 for exposing the P electrode extension layer 7 and at least one second electrode hole 10 for exposing the N-type GaN layer 2 in the opening 6 are formed in the first insulating layer 8 above each chip unit; and for each high-voltage circuit, at least one discrete N electrode connecting metal block 11, P-N electrode connecting metal block 12 and P electrode connecting metal block 13 are formed on a surface of the first insulating layer 8, wherein the N electrode connecting metal block 11 is filled into the second electrode hole 10 of one chip unit at a head end of the high-voltage circuit; the P electrode connecting metal block 13 is filled into the first electrode hole 9 of one chip unit at a tail end of the high-voltage circuit; and the P-N electrode connecting metal block 12 is filled into the isolation trench between two adjacent chip units and is respectively filled into the first electrode hole 9 of one chip unit and the second electrode hole 10 of the other chip unit to serially connect the two adjacent units.

In this embodiment, a second insulating layer 14 further covers the N electrode connecting metal block 11, the P-N electrode connecting metal blocks 12 and the P electrode connecting metal block 13, at least one N electrode hole 15 for exposing the N electrode connecting metal block 11 is formed in the second insulating 14 on the chip unit at the head end of the high-voltage circuit and at least one P electrode hole 16 for exposing the P electrode connecting metal block 13 is formed in the second insulating layer 14 on the chip unit at the tail end of the high-voltage circuit; and discrete N electrode metal layer 17 and P electrode metal layer 18 are further formed on a surface of the second insulating layer 14, wherein the N electrode metal layer 17 is filled into the N electrode hole 15 and the P electrode metal layer 18 is filled into the P electrode hole 16. The substrate 1 is flip-bonded with a base board 19 through the P electrode metal layer 18 and the N electrode metal layer 17 to form a flip device.

In another embodiment, the high-voltage flip LED chip may not comprise the second insulating layer 14, the P electrode metal layer 18 and the N electrode metal layer 17, the substrate 1 is directly flip-bonded with a base board through the N electrode connecting metal block 11, the P-N electrode connecting metal blocks 12 and the P electrode connecting metal block 13, thus the existing mature process can be adopted for packaging and the packaging difficulty is not additionally increased.

Specifically, the substrate 1 can be a plane substrate or a PSS patterned substrate. A circuit is formed on the base board 19. The chip units and the openings 6 therein can be in a shape including but not limited to strip shape, round hole shape or polygonal hole shape. Side walls of the isolation trenches 5 and the openings 6 are vertical or oblique. The P electrode extension layer 7 is a transparent conductive film, a metal layer or a composite layer of the transparent conductive film and the metal layer. The transparent conductive layer can be made of ITO, AZO or ZnO, and the metal layer is an Ag, Al, Rh, Ru, TiW, Ti, Pt, Ni or Cr single metal layer or a composite layer of at least two thereof. The N electrode connecting metal block 11, the P-N electrode connecting metal blocks 12 and the P electrode connecting metal block 13 can be made of metals such as Ag, Al, Rh, Cr, Pt, Au, Ti and Ni or stack structures based on at least two thereof.

Specifically, the areas of the N electrode connecting metal block 11, the P electrode connecting metal block 13 and the P-N electrode connecting metal blocks 12 can be larger, such that large-area metal interconnection among the chip units is realized and the spreading resistance of current on the metal can be enhanced. Simultaneously, since the P-N electrode connecting metal blocks 12 are filled into the isolation trenches 5, the interconnection reliability of the isolation trenches can be improved. Further, metal and insulating materials in the isolation trenches form an ODR, the reflecting capability is greatly improved and thus the product quality and luminous efficiency are improved.

Further, the N electrode metal layer 17 and the P electrode metal layer 18 can adopt large-area metal. Spacing between the N electrode metal layer 17 and the P electrode metal layer 18 can be adjusted according to the actual needs. The large-area spacing-controllable P and N electrodes can guarantee the chip to have good heat dissipating capability and simultaneously reduce the packaging difficulty.

To sum up, the high-voltage flip LED chip and the manufacturing method thereof provided by the present invention have the following beneficial effects: (1) in the LED chip provided by the present invention, the structures of the chip units are substantially consistent, the extendibility is good and the change of working voltage of the chip can be realized by simply increasing basic units; (2) since the chip units are interconnected by adopting large-area metal, the process stability can be improved and the rate of non-defective products and the product reliability are improved; (3) the current spreading capability of the basic chip units is good and a guarantee is provided for high luminous efficiency; (4) the combination of the first insulating layer, the second insulating layer and the interconnecting metal layers form an omnidirectional reflector (ODR) with high reflectivity, the reflecting capability of the reflecting layer can be greatly improved and the luminous efficiency of the LED chip is increased; and simultaneously the insulating layers and metal layers in the isolation trenches also form an omnidirectional reflector, and the luminous efficiency of the product is improved; and (5) the packaging is simple to perform, the large symmetrical electrode structure facilitates the improvement of the packaging simplicity of the chip, the rate of non-defective packaging is improved and simultaneously the heat dissipating capability of the chip is improved. Therefore, the present invention effectively overcomes various disadvantages in the prior art and thus has a great industrial utilization value.

The above-mentioned embodiments are just used for exemplarily describing the principle and effects of the present invention instead of limiting the present invention. One skilled in the art can make modification or variation to the above-mentioned embodiments without going beyond the spirit and range of the present invention. Therefore, all equivalent modifications or variations made by those who have common knowledge in the technical field without departing from the spirit and technical concept disclosed by the present invention shall still be covered by the claims of the present invention.

The invention claimed is:

1. A manufacturing method of a high-voltage flip LED chip, comprising the following steps:
   providing a substrate, and sequentially growing an N-type GaN layer, a multi-quantum-well layer and a P-type GaN layer on the substrate;
   downwards etching from a surface of the P-type GaN layer to form a plurality of isolation trenches to obtain a plurality of chip units through isolation, bottoms of the isolation trenches exposing the substrate;
   forming at least one opening in each chip unit to obtain an MESA, the opening downwards extending from the surface of the P-type GaN layer and exposing the N-type GaN layer that does not penetrate the N-type GaN layer;
   forming a P electrode extension layer on the MESA;
   depositing a first insulating layer which covers portions of a top surface of the P electrode extension layer, a surface of the opening that does not penetrate the N-type GaN layer and a surface of the isolation trench, the top surface facing away from the substrate, and forming, in the first insulating layer above each chip unit, at least one first electrode hole for exposing the P electrode extension layer and at least one second electrode hole for exposing the N-type GaN layer in the opening; and
   for each high-voltage circuit, forming at least one discrete N electrode connecting metal block, P-N electrode connecting metal block and P electrode connecting metal block on a surface of the first insulating layer, wherein the N electrode connecting metal block is filled into the second electrode hole of one chip unit at a head end of the high-voltage circuit; the P electrode connecting metal block is filled into the first electrode hole of one chip unit at a tail end of the high-voltage circuit; and the P-N electrode connecting metal block is filled into the isolation trench between two adjacent chip units and is respectively filled into the first electrode hole of one chip unit and the second electrode hole of the other chip unit to serially connect the two adjacent units.

2. The manufacturing method of the high-voltage flip LED chip according to claim 1, wherein the substrate is flip-bonded with a base board through the N electrode connecting metal block, the P-N electrode connecting metal block and the P electrode connecting metal block.

3. The manufacturing method of the high-voltage flip LED chip according to claim 1, wherein, after the N electrode connecting metal block, the P-N electrode connecting metal block and the P electrode connecting metal block are formed, a second insulating layer which covers each chip unit is deposited, and at least one N electrode hole for exposing the N electrode connecting metal block and at least one P electrode hole for exposing the P electrode connecting metal block are respectively formed in the second insulating layer on the chip units at the head and tail ends of the high-voltage circuit; and then discrete N electrode metal layer and P electrode metal layer are formed on a surface of the second insulating layer, wherein the N electrode metal layer is filled into the N electrode hole and the P electrode metal layer is filled into the P electrode hole.

4. The manufacturing method of the high-voltage flip LED chip according to claim 3, wherein the substrate is flip-bonded with a base board through the P electrode metal layer and the N electrode metal layer.

5. The manufacturing method of the high-voltage flip LED chip according to claim 1, wherein the substrate is a plane substrate or a PSS patterned substrate.

6. The manufacturing method of the high-voltage flip LED chip according to claim 1, wherein a side wall of the opening is vertical or oblique.

7. The manufacturing method of the high-voltage flip LED chip according to claim 1, wherein the P electrode extension layer is a transparent conductive film, a metal layer or a composite layer of the transparent conductive film and the metal layer.

8. The manufacturing method of the high-voltage flip LED chip according to claim 1, wherein the chip unit is in a strip shape, a round hole shape or a polygonal hole shape; and the opening is in a strip shape, a round hole shape or a polygonal hole shape.

9. A high-voltage flip LED chip, comprising:
a substrate, and an N-type GaN layer, a multi-quantum-well layer and a P-type GaN layer sequentially formed on the substrate;
a plurality of chip units obtained through isolation by etching a surface of the P-type GaN layer downwards to form a plurality of isolation trenches, bottoms of the isolation trenches exposing the substrate;
at least one opening formed in each chip unit, the opening downwards extending from the surface of the P-type GaN layer and exposing the N-type GaN layer without penetrating the N-type GaN layer, the surface of the P-type GaN layer around the opening forming a MESA;
a P electrode extension layer formed on the MESA;
a first insulating layer that covers portions of a top surface of the P electrode extension layer, a surface of the opening that does not penetrate the N-type GaN layer and a surface of the isolation trench, the top surface facing away from the substrate;
at least one first electrode hole for exposing the P electrode extension layer and at least one second electrode hole for exposing the N-type GaN layer in the opening in the first insulating layer above each chip unit; and
for each high-voltage circuit, at least one discrete N electrode connecting metal block, P-N electrode connecting metal block and P electrode connecting metal block on a surface of the first insulating layer, wherein the N electrode connecting metal block is filled into the second electrode hole of one chip unit at a head end of the high-voltage circuit; the P electrode connecting metal block is filled into the first electrode hole of one chip unit at a tail end of the high-voltage circuit; and the P-N electrode connecting metal block is filled into the isolation trench between two adjacent chip units and is respectively filled into the first electrode hole of one chip unit and the second electrode hole of the other chip unit to serially connect the two adjacent units.

10. The high-voltage flip LED chip according to claim 9, wherein the substrate is flip-bonded with a base board through the N electrode connecting metal block, the P-N electrode connecting metal block and the P electrode connecting metal block.

11. The high-voltage flip LED chip according to claim 9, wherein a second insulating layer further covers the N electrode connecting metal block, the P-N electrode connecting metal block and the P electrode connecting metal block, at least one N electrode hole for exposing the N electrode connecting metal block is formed in the second insulating on the chip unit at the head end of the high-voltage circuit and at least one P electrode hole for exposing the P electrode connecting metal block is formed in the second insulating layer on the chip unit at the tail end of the high-voltage circuit; and discrete N electrode metal layer and P electrode metal layer are further formed on a surface of the second insulating layer, wherein the N electrode metal layer is filled into the N electrode hole and the P electrode metal layer is filled into the P electrode hole.

12. The high-voltage flip LED chip according to claim 11, wherein the substrate is flip-bonded with a base board through the P electrode metal layer and the N electrode metal layer.

* * * * *